United States Patent
Chen et al.

(10) Patent No.: US 10,991,789 B2
(45) Date of Patent: Apr. 27, 2021

(54) FOLDABLE DISPLAY DEVICE HAVING PLURALITY OF SIGNAL LINES CONNECTED TO NON-FOLDABLE DISPLAY REGIONS

(71) Applicant: BOE Technology Group Co., Ltd., Beijing (CN)

(72) Inventors: Yipeng Chen, Beijing (CN); Li Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/558,849

(22) Filed: Sep. 3, 2019

(65) Prior Publication Data

US 2020/0152725 A1 May 14, 2020

(30) Foreign Application Priority Data

Nov. 9, 2018 (CN) .......................... 201811331148.8

(51) Int. Cl.
| | | |
|---|---|---|
| *H01L 27/32* | (2006.01) | |
| *G09G 3/32* | (2016.01) | |
| *G09G 3/3266* | (2016.01) | |
| *G09G 5/14* | (2006.01) | |
| *H01L 51/00* | (2006.01) | |
| *H01L 51/56* | (2006.01) | |

(52) U.S. Cl.
CPC .......... *H01L 27/3276* (2013.01); *G09G 3/32* (2013.01); *G09G 3/3266* (2013.01); *G09G 5/14* (2013.01);
(Continued)

(58) Field of Classification Search
CPC .................................................. H01L 27/3276
(Continued)

(56) References Cited

U.S. PATENT DOCUMENTS 10,520,978 B1 * 12/2019 Li ........................... G09G 3/20
2007/0211009 A1 * 9/2007 Teranishi ............. G09G 3/3648
345/98

(Continued)

FOREIGN PATENT DOCUMENTS

| CN | 104658466 A | 5/2015 |
| CN | 105301822 A | 2/2016 |

(Continued)

OTHER PUBLICATIONS

Office Action dated Jul. 16, 2020 issued in corresponding Chinese Application No. 201811331148.8 (with English translation).

*Primary Examiner* — Long D Pham
(74) *Attorney, Agent, or Firm* — Muncy, Geissler, Olds and Lowe, P.C.

(57) ABSTRACT

A display substrate, a method of driving the same, a method of manufacturing the same and a display device are provided. The display substrate includes a plurality of non-foldable display regions and a plurality of foldable display regions. The display substrate further includes a first signal line connected to a first electrode and a second signal line connected to a second electrode. The first signal line includes a plurality of secondary signal lines independent of each other. Each secondary signal line corresponds to one of the non-foldable display regions and is configured to control whether to supply power to the corresponding non-foldable display region.

16 Claims, 4 Drawing Sheets

(52) U.S. Cl.
CPC .......... *H01L 51/0097* (2013.01); *H01L 51/56* (2013.01); *G09G 2300/0408* (2013.01); *G09G 2300/0426* (2013.01); *G09G 2310/0202* (2013.01); *G09G 2330/021* (2013.01); *G09G 2380/02* (2013.01); *H01L 2227/323* (2013.01); *H01L 2251/5338* (2013.01)

(58) Field of Classification Search
USPC ........................................................ 345/212
See application file for complete search history.

(56) References Cited

U.S. PATENT DOCUMENTS

| | | |
|---|---|---|
| 2016/0372078 A1 | 12/2016 | Song et al. |
| 2017/0168605 A1 | 6/2017 | Xi et al. |
| 2017/0345365 A1 | 11/2017 | Li |
| 2018/0226028 A1 | 8/2018 | Park et al. |
| 2018/0233091 A1 | 8/2018 | Ma |
| 2018/0277042 A1 | 9/2018 | Noh et al. |
| 2019/0385517 A1 | 12/2019 | Zeng |
| 2020/0027943 A1* | 1/2020 | Kim .................... H01L 27/3276 |

FOREIGN PATENT DOCUMENTS

| | | |
|---|---|---|
| CN | 150976759 A | 9/2016 |
| CN | 106057855 A | 10/2016 |
| CN | 106328081 A | 1/2017 |
| CN | 107180597 A | 9/2017 |
| CN | 107945666 A | 4/2018 |
| CN | 108335660 A | 7/2018 |

* cited by examiner

FOLDABLE DISPLAY DEVICE HAVING PLURALITY OF SIGNAL LINES CONNECTED TO NON-FOLDABLE DISPLAY REGIONS

CROSS-REFERENCE TO RELATED APPLICATION

The present application claims a priority of the Chinese patent application No. 201811331148.8 filed on Nov. 9, 2018, which is incorporated herein by reference in its entirety.

TECHNICAL FIELD

The present disclosure relates to the field of display technology, in particular to a display substrate, a method of driving the same, a method of manufacturing the same and a display device.

BACKGROUND

Along with the development of the flexible display technology, foldable display substrates have been used gradually. In use, for a display device with the foldable display substrate, when the foldable display substrate is in a folded state, a portion of the display substrate forms a display region, and the other portion forms a non-display region. When the foldable display substrate is in an unfolded state, the entire display substrate forms the display area. Usually, when the display substrate is in the folded state, the non-display region is achieved through displaying a zero grayscale, i.e., displaying a fixed color, resulting in relatively large power consumption.

SUMMARY

In one aspect, the present disclosure provides in some embodiments a display substrate, including a plurality of non-foldable display regions and at least one foldable display regions each arranged between two adjacent non-foldable display regions. The display substrate further includes a first electrode and a second electrode. Each subpixel of the display substrate is configured to emit light under the effect of an electric field generated between the first electrode and the second electrode. The display substrate further includes a first signal line connected to the first electrode and a second signal line connected to the second electrode, and the first signal line includes a plurality of secondary signal lines independent of each other. Each secondary signal line corresponds to one of the plurality of non-foldable display regions and is configured to control whether to supply power to the corresponding non-foldable display region.

In a possible embodiment of the present disclosure, the first electrode is connected to a first signal source via the first signal line, and the second electrode is connected to a second signal source via the second signal line.

In a possible embodiment of the present disclosure, each secondary signal line is located at the corresponding non-foldable display region, the secondary signal lines comprise at least one first secondary signal lines, and each first secondary signal line is configured to be switched between a first state and a second state, the first secondary signal line is electrically disconnected from the first signal source for providing an electric signal to the first signal line and electrically connected to the second signal line in the first state, and the first secondary signal line is electrically connected to the first signal source and electrically disconnected from the second signal line in the second state.

In a possible embodiment of the present disclosure, a first switch is arranged between the first secondary signal line and the first signal source, and a second switch is arranged between the first secondary signal line and the second signal line.

In a possible embodiment of the present disclosure, when the first switch is in an off state and the second switch is in an on state, the first secondary signal line is in the first state, and when the first switch is in the on state and the second switch is in the off state, the first secondary signal line is in the second state.

In a possible embodiment of the present disclosure, the first switch is arranged between the first secondary signal line and a second secondary signal line or between the first secondary signal line and the first signal source.

In a possible embodiment of the present disclosure, the secondary signal line further includes the second secondary signal line connected to the first signal source and electrically disconnected from the second signal line all the time.

In a possible embodiment of the present disclosure, when a display content needs to be displayed normally at the foldable display region, the first electrode at the foldable display region is connected to an adjacent secondary second signal line, and when the display content does not need to be displayed normally at the foldable display region, the first electrode at the foldable display region is connected to an adjacent first secondary signal line.

In a possible embodiment of the present disclosure, one of the first electrode and the second electrode is a cathode, and the other is an anode.

In a possible embodiment of the present disclosure, the display substrate further includes a gate line connection control switch configured to control a connection state between a gate on array (GOA) circuitry and a gate line at each non-foldable display region.

In a possible embodiment of the present disclosure, the display substrate is an organic light-emitting diode (OLED) display substrate or a quantum-dot light-emitting diode (QLED) display substrate.

In another aspect, the present disclosure provides in some embodiments a method of manufacturing a display substrate. The display substrate includes a plurality of non-foldable display regions and at least one foldable display regions each arranged between two adjacent non-foldable display regions. The display substrate further includes a first electrode and a second electrode, and each subpixel of the display substrate is configured to emit light under the effect of an electric field generated between the first electrode and the second electrode. The method includes forming a first signal line connected to the first electrode and a second signal line connected to the second electrode. The first signal line includes a plurality of secondary signal lines independent of each other. Each secondary signal line corresponds to one of the plurality of non-foldable display regions and is configured to control whether to supply power to the corresponding non-foldable display region.

In a possible embodiment of the present disclosure, each secondary signal line is located at the corresponding non-foldable display region, and the secondary signal lines include at least one first secondary signal lines. Each first secondary signal line is configured to be switched between a first state and a second state, the first secondary signal line is electrically disconnected from a first signal source and electrically connected to the second signal line in the first state, and the first secondary signal line is electrically connected to the first signal source and electrically disconnected from the second signal line in the second state.

In a possible embodiment of the present disclosure, the method further includes providing a first switch between the first secondary signal line and the first signal source and providing a second switch between the first secondary signal line and the second signal line.

In a possible embodiment of the present disclosure, the method further includes forming gate lines. The forming the gate lines includes: forming a gate line corresponding to each non-foldable display region; and providing a gate line connection control switch configured to control a connection state between a GOA circuitry and the gate line at each non-foldable display region.

In yet another aspect, the present disclosure provides in some embodiments a display device including the above-mentioned display substrate.

In still yet another aspect, the present disclosure provides in some embodiments a method of driving a display substrate. The display substrate includes a plurality of non-foldable display regions and at least one foldable display regions each arranged between two adjacent non-foldable display regions. The display substrate further includes a first electrode and a second electrode. Each subpixel of the display substrate is configured to emit light under the effect of an electric field generated between the first electrode and the second electrode. The display substrate further includes a first signal line connected to the first electrode and a second signal line connected to the second electrode, and the first signal line includes a plurality of secondary signal lines independent of each other. Each secondary signal line corresponds to one of the plurality of non-foldable display regions and is located at the corresponding non-foldable display region. The method includes controlling whether to supply power to each non-foldable display region through the secondary signal line corresponding to the non-foldable display region.

In a possible embodiment of the present disclosure, the secondary signal lines include at least one first secondary signal lines, and each first secondary signal line is configured to be switched between a first state and a second state. The controlling whether to supply power to each non-foldable display region through the secondary signal line corresponding to the non-foldable display region includes: in the first state, controlling the first secondary signal line to be electrically disconnected from a first signal source for providing an electric signal to the first signal line, and controlling the first secondary signal line to be electrically connected to the second signal line; and in the second state, controlling the first secondary signal line to be electrically connected to the first signal source, and controlling the first secondary signal line to be electrically disconnected from the second signal line.

In a possible embodiment of the present disclosure, when a first switch is arranged between the first secondary signal line and the first signal source, and a second switch is arranged between the first secondary signal line and the second signal line, the method further includes: in the first state, controlling the first switch to be in an off state and controlling the second switch to be in an on state; and in the second state, controlling the first switch to be in the on state and controlling the second switch to be in the off state.

In a possible embodiment of the present disclosure, the display substrate further includes a gate line connection control switch. The method further includes: when the first secondary signal line is in the first state, controlling the gate line connection control switch corresponding to a same non-foldable display region as the first secondary signal line to be in the off state; and when the first secondary signal line is in the second state, controlling the gate line connection control switch corresponding to a same non-foldable display region as the first secondary signal line to be in the on state. The gate line connection control switch is configured to control a connection state between a GOA circuitry and a gate line at each non-foldable display region.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

First Embodiment

The present disclosure provides in this embodiment a display substrate.

The display substrate may be, but not limited to, an OLED display substrate or a QLED display substrate.

Figure 1:
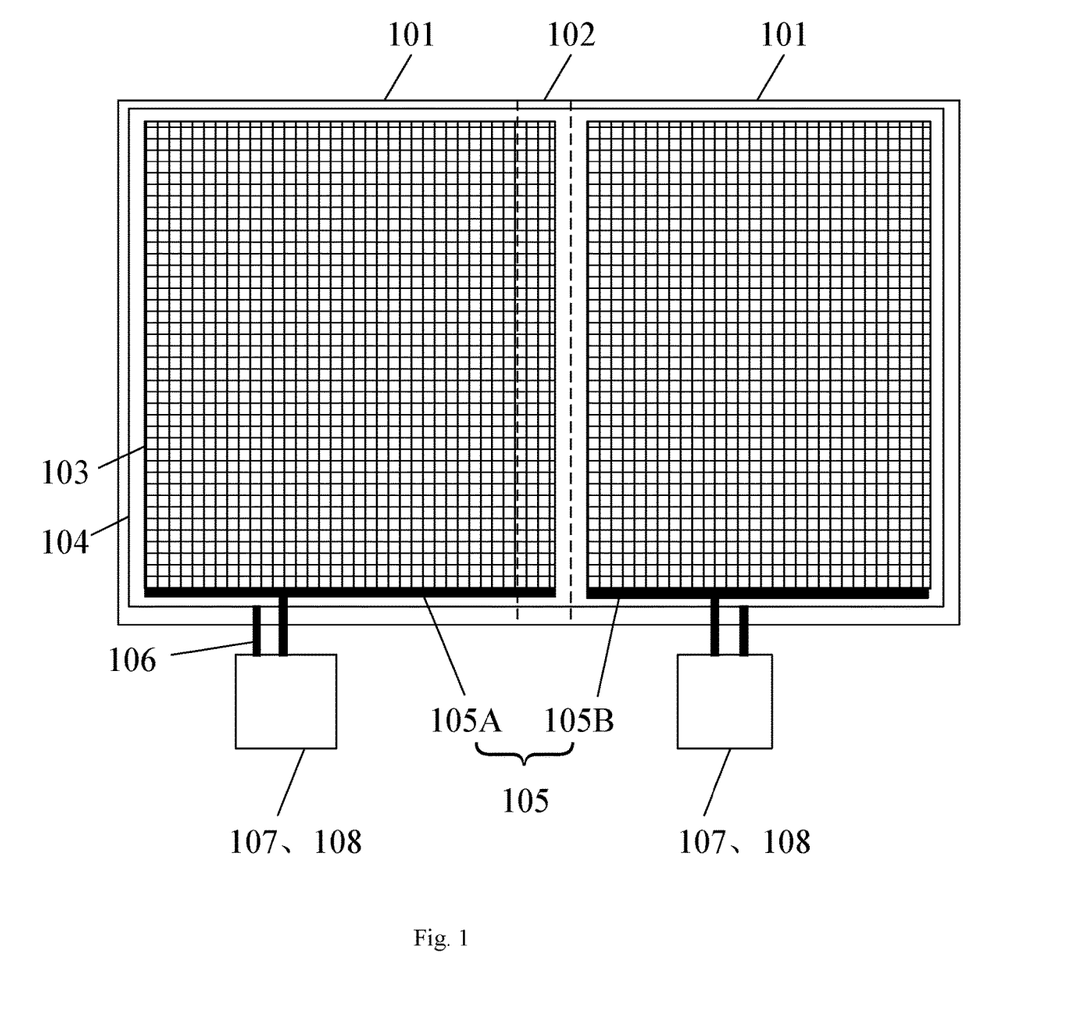
FIG. 1 is a schematic view showing a display substrate according to one embodiment of the present disclosure.

The display substrate may be a foldable display substrate. As shown in FIG. 1, the display substrate may include a plurality of non-foldable display regions 101 and a plurality of foldable display regions 102 each arranged between two adjacent non-foldable display regions 101.

In this embodiment, the display substrate may include the plurality of non-foldable display regions 101 and the plurality of foldable display regions 102 each arranged between two adjacent non-foldable display regions 101. In use, each non-foldable display region 101 may be in a flat state all the time. Each foldable display region 102 may be of a flexible structure, and it may be folded in use. For example, the display substrate in FIG. 1 may include two non-foldable display regions 101 and one foldable display region 102 arranged between the two non-foldable display regions 101.

Figure 2:
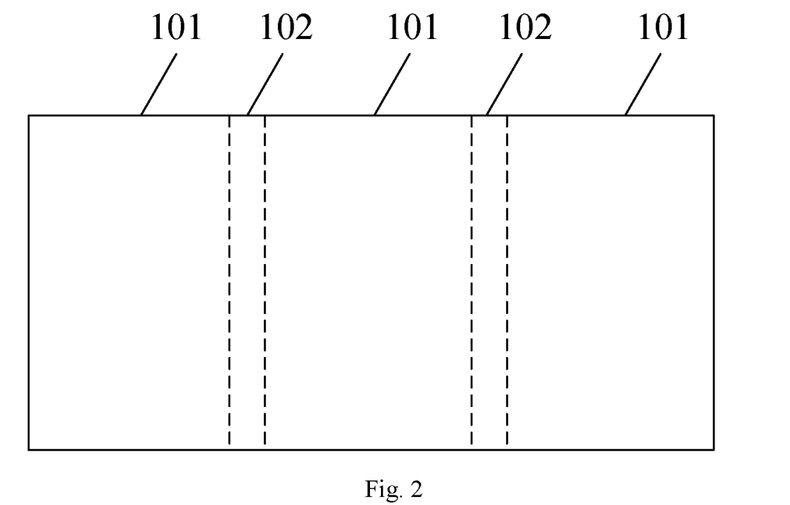
FIG. 2 is another schematic view showing the display substrate according to one embodiment of the present disclosure.

The number of the non-foldable display regions 101 in the display substrate may not be limited to two. As shown in FIG. 2, the display substrate may include three non-foldable display regions 101 and two foldable display regions 102 each arranged between two adjacent non-foldable display regions 101.

Figure 3:
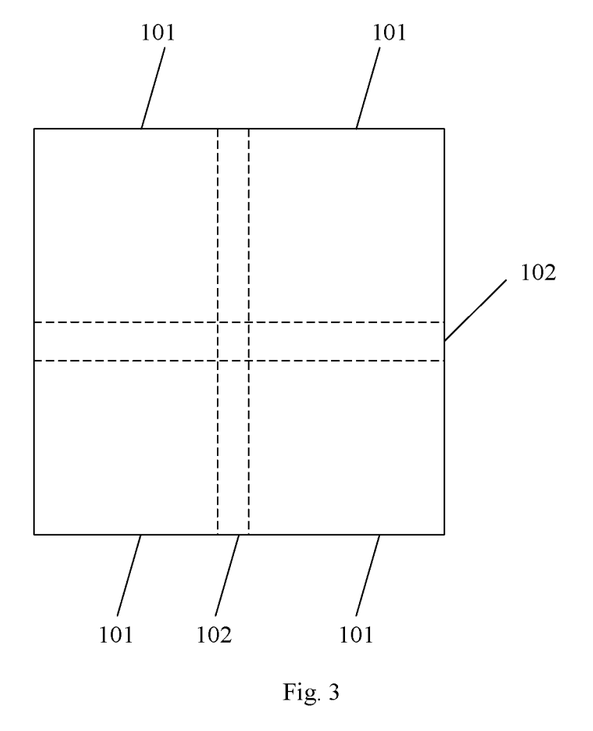
FIG. 3 is yet another schematic view showing the display substrate according to one embodiment of the present disclosure.

As shown in FIG. 3, the display substrate may further include four non-foldable display regions 101 and foldable display regions each arranged between two adjacent non-foldable display regions 101. During the implementation, the number and the positions of the non-foldable display regions 101 may be provided according to the practical need, and thus will not be particularly defined herein.

In use, the display substrate may be folded along each foldable display region 102 between the two adjacent non-foldable display regions 101, or it may be unfolded as a whole. When the display substrate is in an unfolded state, a display content may be normally displayed at an entire active area of the display substrate, and when the display substrate is in a folded state, the display content may be normally displayed at one or parts of the non-foldable display regions 101.

The display substrate may include a first electrode 103 and a second electrode 104. One of the first electrode 103 and the second electrode 104 may be an anode, and the other one may be a cathode. For example, the first electrode 103 may be an anode and the second electrode 104 may be a cathode, or the first electrode 103 may be a cathode and the second electrode 104 may be an anode. Each subpixel of the display substrate may emit light under the effect of an electric field generated between the first electrode 103 and the second electrode 104.

The display substrate may include a first signal line 105 connected to the first electrode 103 and a second signal line 106 connected to the second electrode 104. The first signal line 105 may include a plurality of secondary signal lines independent of each other. Each secondary signal line may correspond to one of the non-foldable display regions 101, and may be located at the corresponding non-foldable display region 101.

As shown in FIG. 1, in this embodiment, the first electrode 103 may be connected to a first signal source 107 via the first signal line 105, and the second electrode 104 may be connected to a second signal source 108 via the second signal line 106. Here, the first signal source 107 and the second signal source 108 may refer to signal sources for providing electric signals to the first electrode 103 and the second electrode 104 respectively, and they are known for a conventional display substrate and thus will not be particularly defined herein.

Each secondary signal line is configured to control whether to supply power to the corresponding non-foldable display region 101. Hence, when the display substrate is in the unfolded state, the power may be supplied to each non-foldable display region 101 via the corresponding secondary signal line, so as to ensure the normal use of the display substrate. When a part of the non-foldable display regions 101 are in the folded state, no power may be supplied to the corresponding non-foldable display regions 101 via the secondary signal lines, so as to prevent any current from flowing through the corresponding non-foldable display regions 101, thereby to reduce the power consumption for the display substrate.

To be specific, the secondary signal lines may include at least one first secondary signal line 105A. The first secondary signal line 105A may refer to a secondary signal line capable of being switched between a first state, in which the first secondary signal line 105A is electrically disconnected from the first signal source 107 for providing an electric signal to the first signal line 105 and electrically connected to the second signal line 106, and a second state, in which the first secondary signal line 105A is electrically connected to the first signal source 107 and electrically disconnected from the second signal line 106.

In this embodiment, the first state and the second state of the first secondary signal line 105A may correspond to a non-normal display state and a normal display state of the corresponding non-foldable display region 101.

When one non-foldable display region 101 is in the non-normal display state, i.e., the non-foldable display region 101 is in the folded state and no display content needs to be displayed, the first secondary signal line 105A corresponding to the non-foldable display region 101 may be switched to be in the first state. At this time, the first secondary signal line 105A corresponding to the non-foldable display region 101 may be electrically disconnected from the first signal source 107 for providing the electric signal to the first signal line 105, and electrically connected to the second signal line 106. In this regard, the first electrode 103 and the second electrode 104 at the non-foldable display region 101 may be short-circuited. Theoretically, a voltage difference between the first electrode 103 and the second electrode 104 may be zero, i.e., no power is consumed. In actual use, due to resistances of the first electrode 103 and the second electrode 104, very tiny power consumption may probably occur, but it is still able to reduce the power consumption to the greatest extent.

When one non-foldable display region 101 is in the normal display state, the first secondary signal line 105A corresponding to the non-foldable display region 101 may be switched to be in the second state. At this time, the first secondary signal line 105A may be electrically connected to the first signal source 107, and electrically disconnected from the second signal line 106, so as to normally supply power to the electrodes at the non-foldable display region 101, thereby to achieve a display function.

In a possible embodiment of the present disclosure, each secondary signal line corresponding to the non-foldable display region 101 of the display substrate may be the first secondary signal line 105A. In this way, it is able to select the non-foldable display regions 101 where the display content is displayed normally according to the practical need, and switch the first secondary signal lines 105A corresponding to the other non-foldable display regions 101 where no display content is displayed normally to be in the first state, so as to reduce the power consumption. At this time, the secondary signal lines corresponding to the non-foldable display regions 101 where the display content is displayed normally may be maintained in the second state.

In another possible embodiment of the present disclosure, the secondary signal lines may further include a second secondary signal line 105B. Here, the second secondary signal line 105B may refer to a secondary signal line connected to the first signal source 107 and electrically disconnected from the second signal line 106 all the time. No matter whether the display substrate is in the folded state or the unfolded state, the display content may be displayed normally at the non-foldable display region 101 corresponding to the second secondary signal line 105B.

For example, the display substrate may include two non-foldable display regions 101 and one foldable display region 102 arranged between the two non-foldable display regions 101.

When the display substrate is configured in such a manner that the display content is displayed at one of the non-foldable display regions 101 in the folded state and the other non-foldable display region 101 is in an off-working state all the time, the secondary signal line corresponding to the non-foldable display region 101 where the display content is displayed normally in the folded state may be set as the second secondary signal line 105B, and the secondary signal line corresponding to the other non-foldable display region 101 may be set as the first secondary signal line 105A.

When the display substrate is not provided with a fixed non-foldable display region 101 where the display content is to be displayed normally, the secondary signal lines corresponding to the two non-foldable display regions 101 may be set as the first secondary signal lines 105A. In use, according to the practical need, the first secondary signal line 105A corresponding to the non-foldable display region 101 where the display content is to be displayed normally may be maintained in the second state, and the first secondary signal line 105A corresponding to the non-foldable display region 101 where no display content needs to be displayed normally may be switched to be in the first state.

Further, as shown in FIG. 1, for the foldable display region 101 between two non-foldable display regions 101, when the display content needs to be displayed normally at the foldable display region 102 (e.g., the foldable display region 102 serves as a lateral display region), the first electrode 103 at the foldable display region 102 may be connected to the adjacent second secondary signal line 105B, so as to receive the electric signal therefrom. When no display content needs to be displayed normally at the foldable display region 102, the first electrode 103 at the foldable display region 102 may be connected to the adjacent first secondary signal line 105A, so as to receive the electric signal therefrom. In this regard, it is also able to control a working current flowing through the first electrode 103 at the foldable display region 102, thereby to reduce the power consumption for the display substrate in the folded state.

Hence, when the display substrate is in the unfolded state, each secondary signal line of the first signal line 105 may be connected to the first signal source 107, and at this time each non-foldable display region of the display substrate may operate normally. When the display substrate is in the folded state, it is unnecessary to switch the first secondary signal line 105A corresponding to the non-foldable display region 101 where the display content is to be displayed to the first state. At this time, the no current may flow through a display element at the non-foldable display region 101 corresponding to the secondary signal line 105A, so it is able to reduce the power consumption for the display substrate.

Further, a first switch 109 may be arranged between the first secondary signal line 105A and the first signal source 107, and a second switch 110 may be arranged between the first secondary signal line 105A and the second signal line 106.

When the first switch 109 is in an off state and the second switch 110 is in an on state, the first secondary signal line 105A may be in the first state, and when the first switch 109 is in the on state and the second switch 110 is in the off state, the first secondary signal line 105A may be in the second state. Through the first switch 109 and the second switch 110, it is able to switch the first secondary signal line 105A between the first state and the second state more conveniently.

Figure 4:
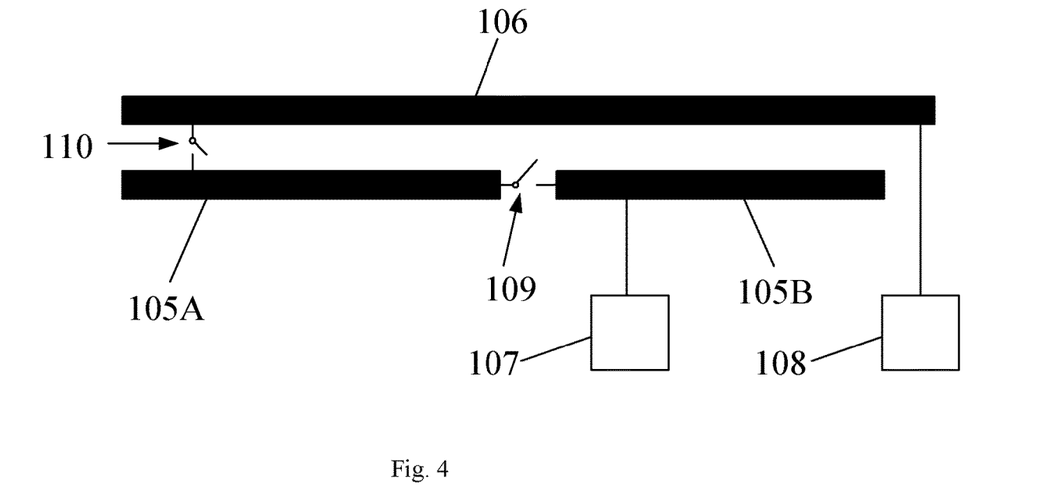
FIG. 4 is a schematic view showing a connection mode of a first signal line and a second signal line according to one embodiment of the present disclosure.

As shown in FIG. 4, the first switch 109 may be arranged between the first secondary signal line 105A and the second secondary signal line 105B. When the first switch 109 is in the off state, the first secondary signal line 105A may be electrically disconnected from the first signal source 107. When the first switch 109 is in the on state, the first secondary signal line 105A may be electrically connected to the first signal source 107.

Figure 5:
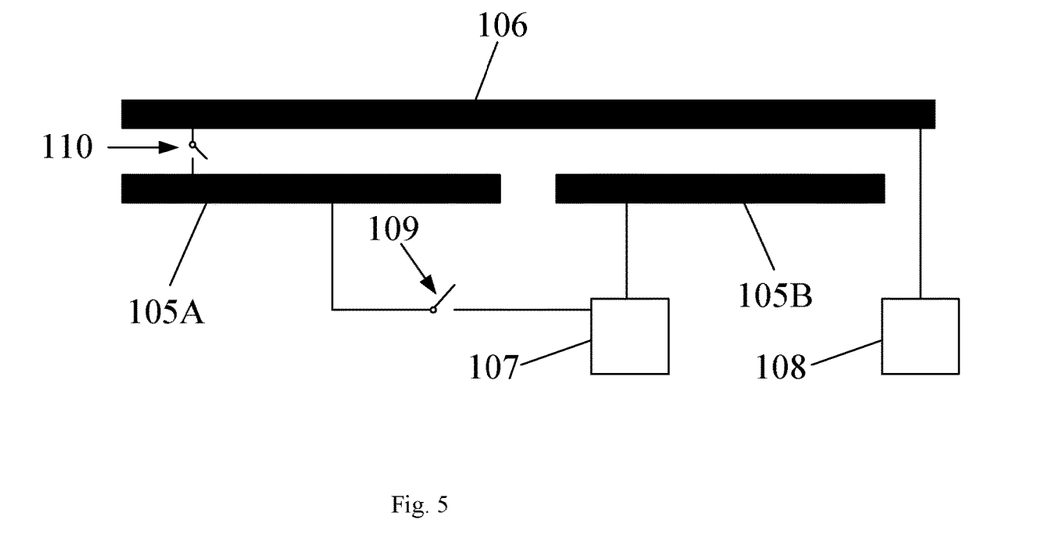
FIG. 5 is a schematic view showing another connection mode of the first signal line and the second signal line according to one embodiment of the present disclosure.

As shown in FIG. 5, the first switch 109 may be directly arranged between the first secondary signal line 105A and the first signal source 107, so as to control the first secondary signal line 105A to be electrically connected to, or electrically disconnected from, the first signal source 107 through the first switch 109.

Further, one of the first electrode 103 and the second electrode 104 may be a cathode configured to receive a VSS signal, and the other one may be an anode configured to receive a VDD signal. For example, the first electrode 103 may be an anode and the second electrode 104 may be a cathode, or the second electrode 104 may be anode and the first electrode 103 may be a cathode.

Figure 6:
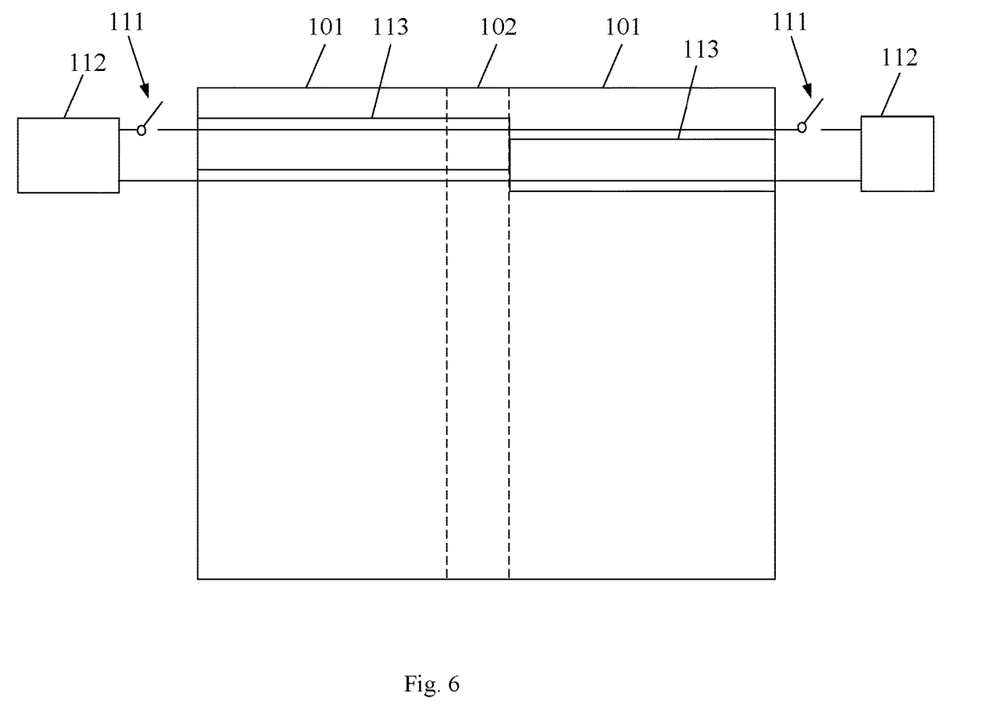
FIG. 6 is a schematic view showing a connection mode of a gate line connection control switch according to one embodiment of the present disclosure.

As shown in FIG. 6, the display substrate may further include a gate line connection control switch 111 configured to control a connection state between a GOA circuitry 112 and a gate line 113 at each non-foldable display region 101.

When one non-foldable display region 101 is in the non-normal display state, the gate line connection control switch 111 may be in the off state. At this time, the gate line 113 at the non-foldable display region 101 may be electrically disconnected from the GOA circuitry 112, so as to further reduce the power consumption caused by the GOA circuitry 112 in an operating state.

Second Embodiment

The present disclosure further provides in this embodiment a method of manufacturing a display substrate.

The method may be adopted to manufacture the above-mentioned display substrate, e.g., an OLED display substrate or a QLED display substrate.

In this embodiment, the method may include forming the first signal line 105 connected to the first electrode 103 and the second signal line 106 connected to the second electrode 104. The first signal line 105 may include a plurality of secondary signal lines independent of each other. Each secondary signal line may correspond to one of the non-foldable display regions 101 and be located at the corresponding non-foldable display region 101.

In this embodiment, the formation of the first signal line 105 may refer to a manufacture process of a conventional display substrate, with a main difference in that the first signal line 105 includes a plurality of secondary signal lines independent of each other, and each secondary signal line corresponds to one of the non-foldable display regions 101 and is located at the corresponding non-foldable display region 101.

The secondary signal line is configured to control whether to supply power to the corresponding non-foldable display region 101. Hence, when the display substrate is in the unfolded state, the power may be supplied to each non-foldable display region via the corresponding secondary signal line, so as to ensure the normal use of the display substrate. When a part of the non-foldable display regions 101 are in the folded state, no power may be supplied to the corresponding non-foldable display regions 101 via the secondary signal lines, so as to prevent any current from flowing through the corresponding non-foldable display regions 101, thereby to reduce the power consumption for the display substrate.

Further, the secondary signal lines may include at least one first secondary signal line 105A. The first secondary signal line 105A may be switched between a first state, in which the first secondary signal line 105A is electrically disconnected from the first signal source 107 for providing an electric signal to the first signal line 105 and electrically connected to the second signal line 106, and a second state, in which the first secondary signal line 105A is electrically connected to the first signal source 107 and electrically disconnected from the second signal line 106.

The method in this embodiment may be adopted to manufacture the above-mentioned display substrate, so the display substrate may at least have the above-mentioned technical effects, which will not be particularly defined herein.

The method may further include providing the first switch 109 between the first secondary signal line 105A and the first signal source 107 and providing the second switch 110 between the first secondary signal line 105A and the second signal line 106.

In this embodiment, the first switching 109 may be arranged between the first secondary signal line 105A and the first signal source 107, and the second switch 110 may be arranged between the first secondary signal line 105A and the second signal line 106. When the first switch 109 is in the off state and the second switch 110 is in the on state, the first secondary signal line 105A may be in the first state, and when the first switch 109 is in the on state and the second switch 110 is in the off state, the first secondary signal line 105A may be in the second state.

Through the first switch 109 and the second switch 110, it is able to switch the first secondary signal line 105A between the first state and the second state more conveniently.

The method may further include forming the gate lines 113. The forming the gate lines 113 may include: forming the gate line 113 corresponding to each non-foldable display region 101; and providing the gate line connection control switch 111 configured to control a connection state between the GOA circuitry 112 and the gate line 113 at each non-foldable display region 101.

In this embodiment, the formation of the gate lines 113 may refer to that known in the art, and thus will not be particularly defined herein.

When one non-foldable display region 101 is in the non-normal display state, the gate line connection control switch 111 may be in the off state. At this time, the gate line 113 at the non-foldable display region 101 may be electrically disconnected from the GOA circuitry 112, so as to further reduce the power consumption caused by the GOA circuitry 112 in an operating state.

Third Embodiment

The present disclosure further provides in this embodiment a display device including the above-mentioned display substrate. The display device is at least capable of achieving the above technical effects, which will thus not be particularly defined herein.

In this embodiment, the display device may include, but not limited to, mobile phone, flat-panel computer, laptop computer, personal digital assistant, vehicle-mounted terminal, wearable device or pedometer.

Fourth Embodiment

The present disclosure further provides in this embodiment a method for driving a display substrate.

In this embodiment, the method may be adopted to drive the above-mentioned display substrate, and a structure of the display substrate will be particularly defined herein.

The method may include controlling whether to supply power to each non-foldable display region 101 through the secondary signal line corresponding to the non-foldable display region 101.

In this embodiment, the secondary signal lines may correspond to different non-foldable display regions 101, so it is able control whether to supply power to the each non-foldable display region 101 through the corresponding secondary signal line. Hence, when one non-foldable display region 101 is in an off-working state, no power may be supplied to the non-foldable display region 101 through the secondary signal line corresponding to the non-foldable display region 101, so as to reduce the power consumption for the display substrate. When one non-foldable display region 101 is in a working state, power may be supplied to the non-foldable display region 101 through the corresponding secondary signal line, so as to enable the non-foldable display region 101 to operate normally.

Further, the controlling whether to supply power to each non-foldable display region 101 through the secondary signal line corresponding to the non-foldable display region 101 may include: in the first state, controlling the first secondary signal line 105A to be electrically disconnected from the first signal source 107 for providing an electric signal to the first signal line 105, and controlling the first secondary signal line 105A to be electrically connected to the second signal line 106; and in the second state, controlling the first secondary signal line 105A to be electrically connected to the first signal source 107, and controlling the first secondary signal line 105A to be electrically disconnected from the second signal line 106.

In this embodiment, the first state may be a state of the first secondary signal line 105A corresponding to the non-foldable display region 101 when the non-foldable display region 101 is in a non-normal display state, and the second state may be a state of the first secondary signal line 105A corresponding to the non-foldable display region 101 when the non-foldable display region 101 is in a normal display state.

Through controlling the first secondary signal line 105A to be switched between the first state and the second state, it is able to control the corresponding non-foldable display region 101 to be switched between the normal display state and the non-normal display state, thereby to enable the non-foldable display region to operate normally in the normal display state and reduce the power consumption in the non-formal display state.

When the first switch 109 is arranged between the first secondary signal line 105A and the first signal source 107 and the second switch 110 is arranged between the first secondary signal line 105A and the second signal line 106, the method may further include: in the first state, controlling the first switch 109 to be in the off state and controlling the second switch 110 to be in the on state; and in the second state, controlling the first switch 109 to be in the on state and controlling the second switch 110 to be in the off state.

In this embodiment, through controlling the first switch 109 and the second switch 110, it is able to control the corresponding first secondary signal line 105A to be switched between the first state and the second state more conveniently.

When the display substrate further includes the gate line connection control switch 111, the method may further include: when the first secondary signal line 105A is in the first state, controlling the gate line connection control switch 111 corresponding to a same non-foldable display region 101 as the first secondary signal line 105A to be in the off state; and when the first secondary signal line 105A is in the second state, controlling the gate line connection control switch 111 corresponding to a same non-foldable display region 101 as the first secondary signal line 105A to be in the on state.

In this embodiment, the gate line connection control switch 111 is configured to control a connection state between the GOA circuitry 112 and the gate line 113 at each non-foldable display region 101. When the first secondary signal line 105A is in the first state, the corresponding gate line connection control switch 111 may be in the off state. At this time, the gate line 113 at the non-foldable display region 101 may be electrically disconnected from the GOA circuitry 112, so as to further reduce the power consumption caused by the GOA circuitry 112 in an operating state. When the first secondary signal line 105A is in the second state, the corresponding gate line connection control switch 111 may be in the on state, so as to enable the GOA circuitry 112 to operate normally.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display substrate, comprising:
a plurality of non-foldable display regions;
at least one foldable display regions each arranged between two adjacent non-foldable display regions;
a first electrode and a second electrode, a subpixel of the display substrate being configured to emit light under the effect of an electric field generated between the first electrode and the second electrode; and
a first signal line connected to the first electrode and a second signal line connected to the second electrode,
wherein the first signal line comprises a plurality of secondary signal lines independent of each other, and the plurality of secondary signal line corresponds to one of the plurality of non-foldable display regions and is configured to control whether to supply power to the corresponding non-foldable display region,
wherein the first electrode is connected to a first signal source via the first signal line, and the second electrode is connected to a second signal source via the second signal line, and
wherein each secondary signal line is located at the corresponding non-foldable display region, the secondary signal lines comprise at least one first secondary signal lines, and each first secondary signal line is configured to be switched between a first state and a second state, the first secondary signal line is electrically disconnected from the first signal source for providing an electric signal to the first signal line and electrically connected to the second signal line in the first state, and the first secondary signal line is electrically connected to the first signal source and electrically disconnected from the second signal line in the second state.

2. The display substrate according to claim 1, wherein a first switch is arranged between the first secondary signal line and the first signal source, and a second switch is arranged between the first secondary signal line and the second signal line.

3. The display substrate according to claim 2, wherein when the first switch is in an off state and the second switch is in an on state, the first secondary signal line is in the first state, and when the first switch is in the on state and the second switch is in the off state, the first secondary signal line is in the second state.

4. The display substrate according to claim 3, wherein the first switch is arranged between the first secondary signal line and a second secondary signal line or between the first secondary signal line and the first signal source.

5. The display substrate according to claim 1, wherein the secondary signal line further comprises a second secondary signal line connected to the first signal source and electrically disconnected from the second signal line all the time.

6. The display substrate according to claim 1, herein when a display content needs to be displayed normally at the foldable display region, the first electrode at the foldable display region is connected to an adjacent secondary second signal line, and when the display content does not need to be displayed normally at the foldable display region, the first electrode at the foldable display region is connected to an adjacent first secondary signal line.

7. The display substrate according to claim 1, wherein one of the first electrode and the second electrode is a cathode, and the other is an anode.

8. The display substrate according to claim 1, further comprising a gate line connection control switch configured to control a connection state between a gate on array (GOA) circuitry and a gate line at each non-foldable display region.

9. The display substrate according to claim 1, wherein the display substrate is an organic light-emitting diode (OLED) display substrate or a quantum-dot light-emitting diode (QLED) display substrate.

10. A display device comprising the display substrate according to claim 1.

11. A method of manufacturing a display substrate, the display substrate comprising a plurality of non-foldable display regions and at least one foldable display regions each arranged between two adjacent non-foldable display regions, the display substrate further comprising a first electrode and a second electrode, each subpixel of the display substrate being configured to emit light under the effect of an electric field generated between the first electrode and the second electrode, wherein the method comprises:
forming a first signal line connected to the first electrode and a second signal line connected to the second electrode,
wherein the first signal line comprises a plurality of secondary signal lines independent of each other, and each secondary signal line corresponds to one of the plurality of non-foldable display regions and is configured to control whether to supply power to the corresponding non-foldable display region, and
wherein each secondary signal line is located at the corresponding non-foldable display region, the secondary signal lines comprise at least one first secondary signal lines, and each first secondary signal line is configured to be switched between a first state and a second state, the first secondary signal line is electrically disconnected from a first signal source and electrically connected to the second signal line in the first state, and the first secondary signal line is electrically connected to the first signal source and electrically disconnected from the second signal line in the second state.

12. The method according to claim 11, further comprising providing a first switch between the first secondary signal line and the first signal source and providing a second switch between the first secondary signal line and the second signal line.

13. The method according to claim 11, further comprising forming gate lines, wherein the forming the gate lines comprises:
  forming a gate line corresponding to each non-foldable display region; and
  providing a gate line connection control switch configured to control a connection state between a GOA circuitry and the gate line at each non-foldable display region.

14. A method of driving a display substrate, the display substrate comprising a plurality of non-foldable display regions and at least one foldable display regions each arranged between two adjacent non-foldable display regions, the display substrate further comprising a first electrode and a second electrode, each subpixel of the display substrate being configured to emit light under the effect of an electric field generated between the first electrode and the second electrode, the display substrate further comprising a first signal line connected to the first electrode and a second signal line connected to the second electrode, the first signal line comprising a plurality of secondary signal lines independent of each other, each secondary signal line corresponding to one of the plurality of non-foldable display regions and being located at the corresponding non-foldable display region, wherein the method comprises:
  controlling whether to supply power to each non-foldable display region through the secondary signal line corresponding to the non-foldable display region,
  wherein the secondary signal lines comprise at least one first secondary signal lines, and each first secondary signal line is configured to be switched between a first state and a second state, wherein the controlling whether to supply power to each non-foldable display region through the secondary signal line corresponding to the non-foldable display region comprises: in the first state, controlling the first secondary signal line to be electrically disconnected from a first signal source for providing an electric signal to the first signal line, and controlling the first secondary signal line to be electrically connected to the second signal line; and in the second state, controlling the first secondary signal line to be electrically connected to the first signal source, and controlling the first secondary signal line to be electrically disconnected from the second signal line.

15. The method according to claim 14, wherein when a first switch is arranged between the first secondary signal line and the first signal source, and a second switch is arranged between the first secondary signal line and the second signal line, the method further comprises:
  in the first state, controlling the first switch to be in an off state and controlling the second switch to be in an on state; and in the second state, controlling the first switch to be in the on state and controlling the second switch to be in the off state.

16. The method according to claim 14, wherein the display substrate further comprises a gate line connection control switch, wherein the method further comprises:
  when the first secondary signal line is in the first state, controlling the gate line connection control switch corresponding to a same non-foldable display region as the first secondary signal line to be in the off state; and when the first secondary signal line is in the second state, controlling the gate line connection control switch corresponding to a same non-foldable display region as the first secondary signal line to be in the on state,
  wherein the gate line connection control switch is configured to control a connection state between a GOA circuitry and a gate line at each non-foldable display region.

* * * * *